(12) United States Patent
Nam et al.

(10) Patent No.: US 11,178,754 B2
(45) Date of Patent: Nov. 16, 2021

(54) DISPLAY DEVICE AND METHOD OF MANUFACTURING FLEXIBLE PRINTED CIRCUIT BOARD

(71) Applicant: Samsung Display Co., LTD., Yongin-si (KR)

(72) Inventors: Wi Jin Nam, Cheonan-si (KR); Jong Won Moon, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 4 days.

(21) Appl. No.: 16/729,763

(22) Filed: Dec. 30, 2019

(65) Prior Publication Data
US 2020/0288563 A1 Sep. 10, 2020

(30) Foreign Application Priority Data
Mar. 8, 2019 (KR) .................. 10-2019-0027095

(51) Int. Cl.
*H05K 1/00* (2006.01)
*H05K 1/02* (2006.01)
(Continued)

(52) U.S. Cl.
CPC ........... *H05K 1/028* (2013.01); *H05K 1/0373* (2013.01); *H05K 1/147* (2013.01); *H05K 3/0041* (2013.01);
(Continued)

(58) Field of Classification Search
CPC .. H05K 1/00; H05K 1/02; H05K 1/03; H05K 1/14; H05K 1/147; H05K 1/18; H05K 1/028; H05K 1/0281; H05K 3/00; H05K 3/10; H05K 3/18; H05K 3/28; H05K 3/36; H05K 3/361; H05K 3/323; H01L 21/50; H01L 21/481; H01L 23/00; H01L 23/498; H01L 23/4985; H01L 23/538; H01L 23/562
USPC ................ 361/749, 795; 362/606, 607, 227; 174/254, 255, 257; 345/173; 349/106, 349/113, 149, 150, 152; 439/495
See application file for complete search history.

(56) References Cited

U.S. PATENT DOCUMENTS 6,144,216 A * 11/2000 Kajiwara ............... G09G 3/006
324/73.1
6,211,936 B1 * 4/2001 Nakamura .......... G02F 1/13452
349/149
(Continued)

FOREIGN PATENT DOCUMENTS

KR     100601461 B1     7/2006

*Primary Examiner* — Xiaoliang Chen
(74) *Attorney, Agent, or Firm* — Cantor Colburn LLP

(57) ABSTRACT

A display device includes a display panel including a display surface and a rear surface opposite to each other; and a flexible printed circuit board attachable to the display panel at the rear surface of the display panel. The flexible printed circuit board includes a conductive layer, a passivation layer defining an outer surface of the flexible printed circuit board, and a base film between the conductive layer and the passivation layer, the outer surface includes a first region at which the rear surface of the display panel is attachable to the flexible printed circuit board and a second region at which the rear surface of the display panel is not attached to the flexible printed circuit board, and the first region has greater surface roughness than the second region.

12 Claims, 17 Drawing Sheets

(51) Int. Cl.

| | | |
|---|---|---|
| *H05K 1/03* | (2006.01) | |
| *H05K 1/14* | (2006.01) | |
| *H05K 1/18* | (2006.01) | |
| *H05K 3/00* | (2006.01) | |
| *H05K 3/10* | (2006.01) | |
| *H05K 3/18* | (2006.01) | |
| *H05K 3/28* | (2006.01) | |
| *H05K 3/36* | (2006.01) | |
| *H01L 21/50* | (2006.01) | |
| *H01L 23/00* | (2006.01) | |
| *H01L 23/498* | (2006.01) | |
| *H01L 23/538* | (2006.01) | |
| *H01L 27/32* | (2006.01) | |

(52) U.S. Cl.
CPC .......... *H05K 3/285* (2013.01); *H01L 27/3276* (2013.01); *H05K 2201/056* (2013.01); *H05K 2201/10128* (2013.01); *H05K 2203/095* (2013.01)

(56) References Cited

U.S. PATENT DOCUMENTS

| | | | | |
|---|---|---|---|---|
| 10,680,055 | B2* | 6/2020 | Yamazaki | H01L 51/0097 |
| 10,983,560 | B2* | 4/2021 | Kwon | G09G 5/00 |
| 2004/0046909 | A1* | 3/2004 | Sekiguchi | G02F 1/1345 |
| | | | | 349/113 |
| 2005/0048297 | A1* | 3/2005 | Fukuda | C08G 73/1039 |
| | | | | 428/458 |
| 2005/0122700 | A1* | 6/2005 | Kim | H05K 3/361 |
| | | | | 361/795 |
| 2007/0190847 | A1* | 8/2007 | Ichino | H01R 12/62 |
| | | | | 439/495 |
| 2008/0117367 | A1* | 5/2008 | Abe | H05K 3/361 |
| | | | | 349/106 |
| 2011/0005812 | A1* | 1/2011 | Shimokawa | B32B 15/08 |
| | | | | 174/255 |
| 2011/0050612 | A1* | 3/2011 | Matsumoto | G06F 3/041 |
| | | | | 345/173 |
| 2012/0055703 | A1* | 3/2012 | Ishimatsu | H05K 3/361 |
| | | | | 174/257 |
| 2013/0288120 | A1* | 10/2013 | Iida | C08G 73/16 |
| | | | | 429/211 |
| 2014/0306348 | A1* | 10/2014 | Ahn | H05K 1/0281 |
| | | | | 257/773 |
| 2014/0332257 | A1* | 11/2014 | Jee | H05K 3/323 |
| | | | | 174/254 |
| 2015/0226995 | A1* | 8/2015 | Aota | H01L 23/49816 |
| | | | | 349/149 |
| 2015/0261332 | A1* | 9/2015 | Nakamura | G06F 3/0412 |
| | | | | 345/173 |
| 2015/0378083 | A1* | 12/2015 | Takakusaki | G02B 6/002 |
| | | | | 362/607 |
| 2016/0002407 | A1* | 1/2016 | Wakita | C08G 73/1007 |
| | | | | 257/40 |
| 2016/0044751 | A1* | 2/2016 | Ikeda | H01L 27/3293 |
| | | | | 362/227 |
| 2016/0218053 | A1* | 7/2016 | Cho | H01L 24/00 |
| 2017/0062537 | A1* | 3/2017 | Kim | H01L 27/3248 |
| 2017/0069664 | A1* | 3/2017 | Nakamura | H01L 27/3293 |
| 2017/0148702 | A1* | 5/2017 | Funayama | G02F 1/13452 |
| 2018/0006004 | A1* | 1/2018 | Namkung | H01L 27/3276 |
| 2018/0027651 | A1* | 1/2018 | Lim | H05K 3/18 |
| | | | | 361/749 |
| 2018/0081399 | A1* | 3/2018 | Kwon | G06F 1/1652 |
| 2018/0151539 | A1* | 5/2018 | Nakamura | H01L 27/3206 |
| 2018/0160545 | A1* | 6/2018 | Kim | H05K 1/028 |
| 2018/0310404 | A1* | 10/2018 | Lim | H05K 1/0393 |
| 2019/0219863 | A1* | 7/2019 | Tezen | H05K 1/189 |

* cited by examiner

DISPLAY DEVICE AND METHOD OF MANUFACTURING FLEXIBLE PRINTED CIRCUIT BOARD

This application claims priority to Korean Patent Application No. 10-2019-0027095, filed on Mar. 8, 2019, and all the benefits accruing therefrom under 35 U.S.C. § 119, the disclosure of which is incorporated herein by reference in its entirety.

BACKGROUND

1. Field

The present disclosure relates to a display device and a method of manufacturing a flexible printed circuit board ("FPCB").

2. Description of the Related Art

Display devices have increasingly become of great importance with the development of multimedia. A typical display device such as a liquid crystal display ("LCD") device, an organic light-emitting diode ("OLED") display device, or the like may include a display panel in which pixels for realizing the display of images are defined and a printed circuit board ("PCB") which provides signals for driving the display panel.

Due to automation of display device module processes, adhesive layers and release layers can be temporarily attached to various members such as a PCB in the process of manufacturing a display device and can then be removed together once the assembly of the display device is complete.

SUMMARY

Embodiments of the present disclosure provide a display device capable having improved resistance to defects that may occur in connection with process automation.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, a display device includes: a display panel including a display surface and a rear surface which is opposite to the display surface; and a flexible printed circuit board attachable to the display panel at the rear surface of the display panel. The flexible printed circuit board includes a conductive layer, a passivation layer defining an outer surface of the flexible printed circuit board, and a base film between the conductive layer and the passivation layer, the outer surface includes a first region at which the rear surface of the display panel is attachable to the flexible printed circuit board, and a second region at which the rear surface of the display panel is not attached to the flexible printed circuit board, and the first region has greater surface roughness than the second region.

According to one or more embodiment of the present disclosure, removal of an adhesive for temporarily attaching elements used in an automated process and subsequently removed after assembly can be facilitated, and at the same time, the bonding force of an adhesive for bonding such temporary elements can be improved. As a result, defects that may occur during the removal of release layers from the adhesive can be reduced or effectively prevented, and process automation can be realized.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
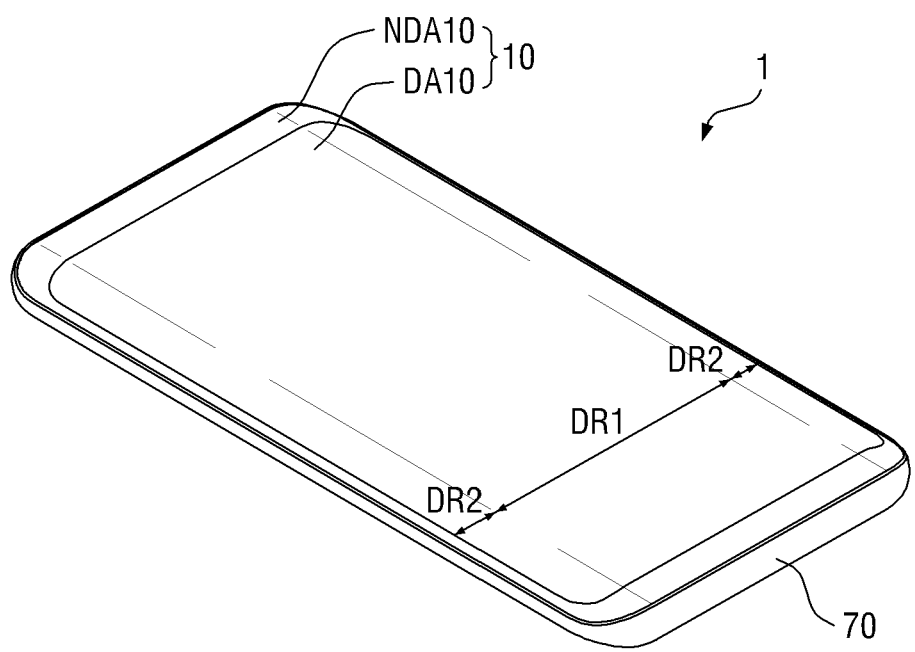
FIG. 1 is a perspective view of an embodiment of a display device.

Features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the invention to those skilled in the art, and the invention will only be defined by the appended claims. Like reference numerals refer to like elements throughout the specification.

It will be understood that when an element or layer is referred to as being related to another element such as being "on," "connected to" or "coupled to" another element or layer, it can be directly on, connected or coupled to the other element or layer or intervening elements or layers may be present. In contrast, when an element is referred to as being related to another elements such as being "directly on," "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Embodiments of the present disclosure will hereinafter be described with reference to the accompanying drawings.

Figure 2:
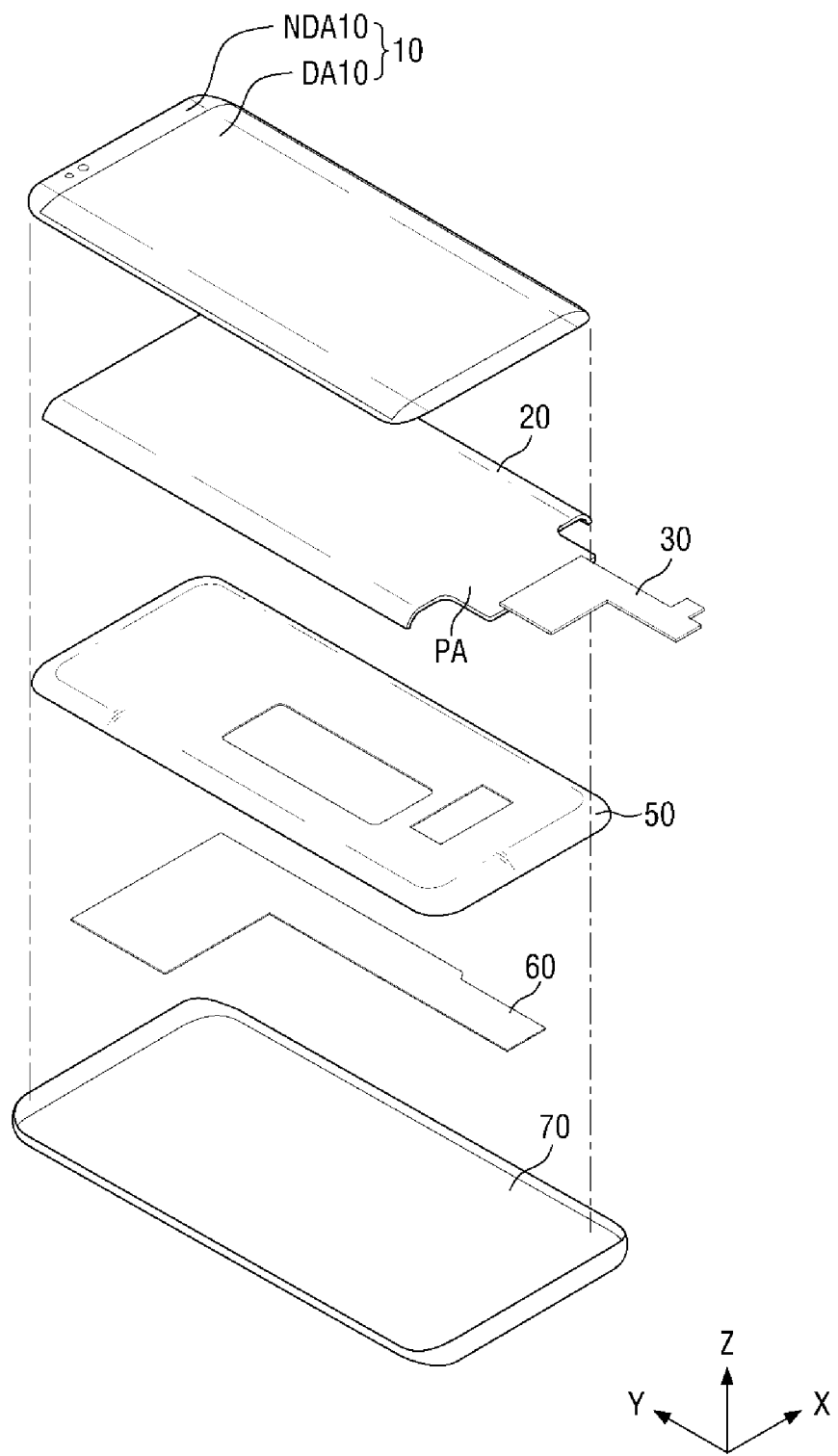
FIG. 2 is an exploded perspective view of the display device of FIG. 1.
Figure 3:
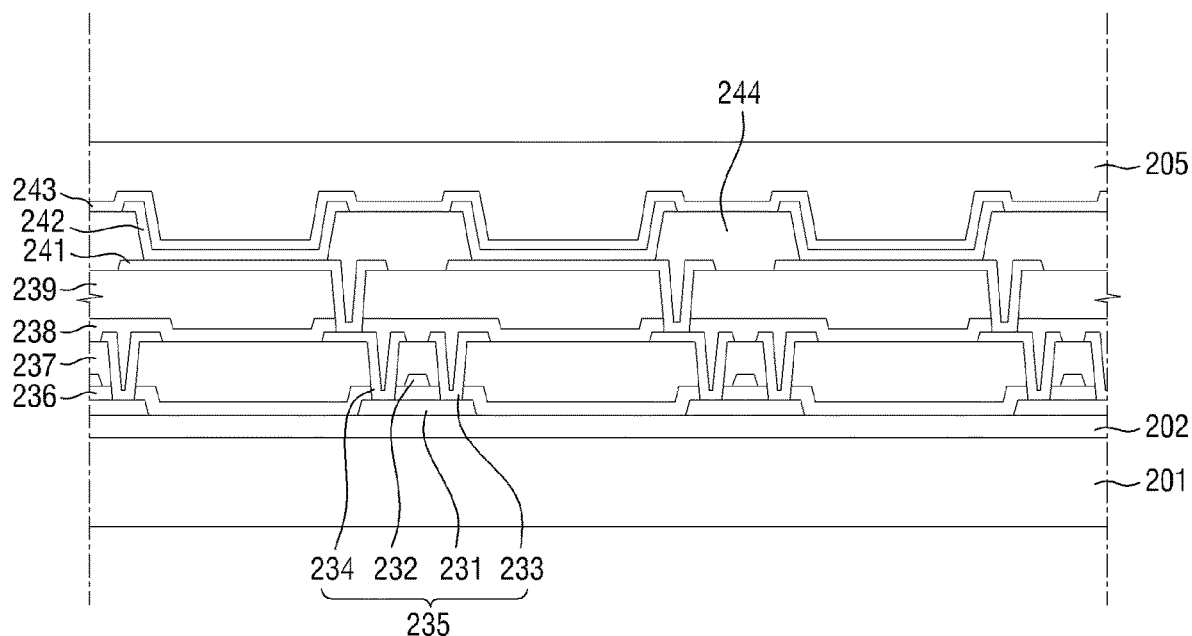
FIG. 3 is an enlarged cross-sectional view illustrating an embodiment of a display area of a display panel in the display device of FIG. 2.
Figure 4:
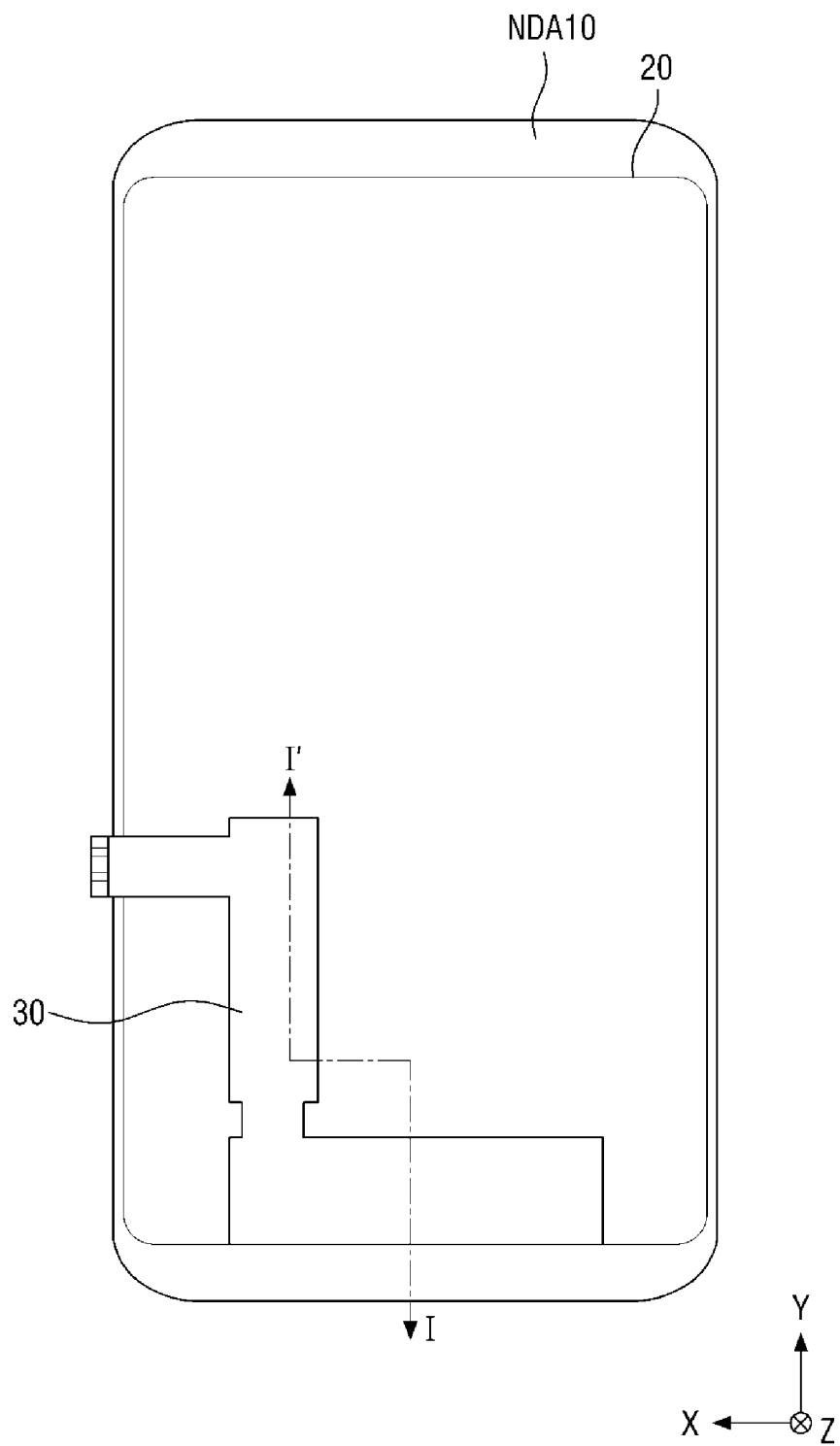
FIG. 4 is a bottom plan view illustrating an embodiment of the display panel of FIG. 2 which is attached to a cover window in the display device of FIG. 2.
Figure 5:
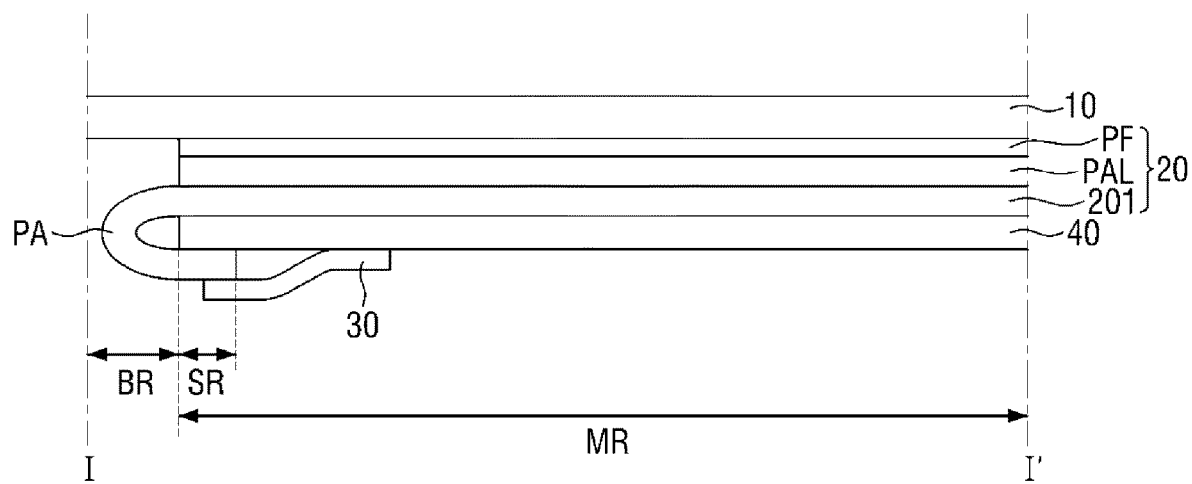
FIG. 5 is an enlarged cross-sectional view taken along line I-I' of FIG. 4.

FIG. 1 is a perspective view of an embodiment of a display device. FIG. 2 is an exploded perspective view of the display device of FIG. 1. FIG. 3 is an enlarged cross-sectional view illustrating an embodiment of a display area of a display panel in the display device of FIG. 2. FIG. 4 is a bottom plan view illustrating an embodiment of the display panel, which is attached to a cover window in the display device of FIG. 2. FIG. 5 is an enlarged cross-sectional view taken along line I-I' of FIG. 4.

Referring to FIGS. 1 through 5, a display device 1 may have a rectangular shape in a plan view. As illustrated in FIGS. 1 and 2, for example, the display device 1 may have a rectangular shape including a pair of relatively short sides extending along a first direction (or an X-axis direction, e.g., X in FIGS. 1 through 5) and a pair of relatively long sides extending along a second direction (or a Y-axis direction, e.g., Y in FIGS. 1 through 5) in a plan view. The corners at which the relatively short sides and the relatively long sides of the display device 1 respectively meet may be rounded with a predetermined curvature or may be right-angled. The planar shape of the display device 1 is not particularly limited, and the display device 1 may be provided or formed in various other shapes such a polygonal shape other than a rectangular shape, a circular shape, or an elliptical shape. A third direction (or a Z-axis direction, e.g., Z in FIGS. 1 through 5) crosses each of the first direction and the second direction. A thickness or thickness direction of the display device 1 and/or components thereof, may be taken along the third direction.

The display device 1 may include a first region DR1 which is flat and a second region DR2 provided in plurality (e.g., second regions DR2) which respectively extend from opposing sides of the first region DR1. The second regions DR2 may be provided or formed to be flat or curved (e.g., curvable). In a case where the second regions DR2 are provided or formed to be flat, the angle that the first region DR1 and the second regions DR2 form relative to each other, may be an obtuse angle. In a case where the second regions DR2 are provided or formed to be curved, the second regions DR2 may have a uniform or varying curvature.

FIG. 1 illustrates that the second regions DR2 extend from both the left and right sides of the first region DR1, but the present disclosure is not limited thereto. Alternatively, a second region DR2 may extend from only one of the left and right sides of the first region DR1. Still alternatively, the second regions DR2 may extend not only from the left and right sides of the first region DR1 which correspond to the relatively long sides of the display device 1, but also from at least one of the upper and lower sides of the first region DR1 which correspond to the relatively short sides of the display device 1. As an embodiment, the second regions DR2 will hereinafter be described as being disposed on both the left and right sides of the display device 1.

A cover window 10 may be disposed above the display panel 20 (e.g., closer to a viewing side of the display device 1 than the display panel 20) to cover the top surface of the display panel 20. The cover window 10 may form the top exterior of the display device 1. Accordingly, the cover window 10 can protect the top surface of the display panel 20. The cover window 10 may be attached to the top surface of the display panel 20 via an adhesive member. The cover window 10 may include or be formed of glass, sapphire, and/or plastic. The cover window 10 may be provided or formed to be rigid or flexible. The adhesive member may be an optically clear adhesive ("OCA") or an optically clear resin ("OCR").

The cover window 10 may include a light-transmitting portion DA10 which corresponds to the display panel 20 and a light-shielding portion NDA10 which corresponds to an entirety of the display device 1 except for the display panel 20. The cover window 10 may be disposed in the first region DR1 and in the second regions DR2 of the display device 1. The light-transmitting portion DA10 may be disposed in a portion of the first region DR1 and also in portions of the second regions DR2.

The light-shielding portion NDA10 may be provided or formed to be opaque. Alternatively, the light-shielding portion NDA10 may be provided or formed as a decorative layer with patterns viewable from outside the display device 1 when no images are displayed thereby. In an embodiment, for example, a company's logo or a string of various characters may be patterned on the light-shielding portion NDA10 as the decorative layer described above.

The display panel 20 may be disposed below the cover window 10. The display panel 20 may be disposed to overlap with the light-transmitting portion DA10 of the cover window 10. The display panel 20 may be disposed in the first region DR1 and in the second regions DR2 of the display device 1. As a result, an image from the display panel 20 can be viewable not only in the first region DR1, but also in the second regions DR2.

As illustrated in FIG. 5, a polarizing film PF may be between the display panel 20 and the cover window 10 to reduce or effectively prevent visibility degradation that may be caused by the reflection of external light incident to the display device 1 from outside thereof. The polarizing film PF may include a polarizer and a phase retardation film such as a λ/4 (or quarter-wave) plate. In this case, the phase retardation film may be disposed on the display panel 20, and the linear polarizer may be disposed between the phase retardation film and the cover window 10.

The display panel 20 may be a light-emitting diode ("LED") display panel including LEDs. In an embodiment, for example, the display panel 20 may be an organic LED ("OLED") display panel (e.g., OLED display panel) using OLEDs, a micro-LED ("mLED") display panel using mLEDs, or a quantum dot LED ("QLED") display panel using QLEDs. The display panel 20 will hereinafter be described as being, for example, an OLED display panel.

As illustrated in FIGS. 3 and 5, the display panel 20 may include a first substrate 201 and a pixel array layer PAL which includes a thin-film transistor ("TFT") layer, a light-emitting element layer, and a thin-film encapsulation layer that are disposed on the first substrate 201. A display area of the display panel 20 refers to a planar area thereof at which the light-emitting element layer is provided or formed to display images and/or emit light for displaying images. A non-display area of the display panel 20 refers to a planar area thereof which is adjacent to the display area, such as extending from the display area to an outer edge of the display panel 20, without being limited thereto. Since the light-transmitting portion DA10 of the cover window 10 is described as corresponding to the display panel 20, both the display area and the non-display area thereof may correspond to the light-transmitting portion DA10 of the cover window 10, without being limited thereto.

The first substrate 201 may be a relatively rigid substrate or may be a relatively flexible substrate that is bendable, foldable or rollable. The first substrate 201 may include or be formed of an insulating material such as glass, quartz, a polymer material, or the like. Examples of the polymer material include plastic such as polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. The first substrate 201 may include a metal material.

The TFT layer is provided or formed on the first substrate 201. The TFT layer includes a TFT 235 which may be provided in plurality (e.g., TFTs 235), a gate insulating film 236, an interlayer insulating film 237, a passivation film 238, and a planarization film 239.

A buffer film 202 may be provided or formed on the first substrate 201. The buffer film 202 may protect the TFTs 235 and light-emitting elements, which are susceptible to moisture, against moisture penetrating the first substrate 201. In an embodiment, for example, the buffer film 202 may be provided or formed as a multilayer film in which a silicon oxide (SiOx) film, a silicon nitride (SiNx) film, and/or a silicon oxynitride (SiON) film are alternately stacked. In an embodiment, the buffer film 202 may be omitted.

The TFTs 235 are provided or formed on the buffer film 202. Each of the TFTs 235 includes an active layer 231, a gate electrode 232, a source electrode 233 and a drain electrode 234. FIG. 3 illustrates each of the TFTs 235 as having a top gate structure in which the gate electrode 232 is disposed above the active layer 231, but the present disclosure is not limited thereto. That is, the TFTs 235 may have a bottom gate structure in which the gate electrode 232 is disposed below the active layer 231 or a double gate structure in which the gate electrode 232 is disposed both above and below the active layer 231.

The active layer 231 is provided or formed on the buffer film 202. The active layer 231 may include or be formed of a silicon-based semiconductor material or an oxide-based semiconductor material. A light-shielding layer (not shown) for blocking external light incident on the active layer 231 may be provided or formed between the buffer layer and the active layer 231.

The gate insulating film 236 may be provided or formed on the active layer 231. The gate insulating film 236 may be provided or formed as an inorganic film such as, for example, a silicon oxide film, a silicon nitride film, or a multilayer film thereof.

The gate electrode 232 and a gate line may be provided or formed on the gate insulating film 236. The gate electrode 232 and the gate line may be provided or formed as single- or multilayer films using molybdenum (Mo), Al, chromium (Cr), gold (Au), titanium (Ti), Ni, neodymium (Nd), Cu, or an alloy thereof.

The interlayer insulating film 237 may be provided or formed on the gate electrode 232 and the gate line. The interlayer insulating film 237 may be provided or formed as an inorganic film such as, for example, a silicon oxide film, a silicon nitride film, or a multilayer film thereof.

The source electrode 233, the drain electrode 234, and a data line may be provided or formed on the interlayer insulating film 237. The source electrode 233 and the drain electrode 234 may be connected to the active layer 231 at or through contact holes respectively penetrating the gate insulating film 236 and/or the interlayer insulating film 237. The source electrode 233, the drain electrode 234, and the data line may be provided or formed as single- or multilayer films using Mo, Al, Cr, Au, Ti, Ni, Nd, Cu, or an alloy thereof.

The passivation film 238 may be provided or formed on the source electrode 233, the drain electrode 234, and the data line to insulate the TFTs 235. The passivation film 238 may be provided or formed as an inorganic film such as, for example, a silicon oxide film, a silicon nitride film, or a multilayer film thereof.

The planarization film 239 may be provided or formed on the passivation film 238 to planarize height differences formed by elements or layers in and adjacent to the TFTs 235. The planarization film 239 may be provided or formed as an organic film using an acrylic resin, an epoxy resin, a phenolic resin, a polyamide resin, or a polyimide resin.

The light-emitting element layer is provided or formed on the TFT layer. The light-emitting element layer includes light-emitting elements and a pixel defining film 244.

The light-emitting elements and the pixel defining film 244 are provided or formed on the planarization film 239. The light-emitting elements may respectively be OLEDs. In this case, each of the light-emitting elements may include an anode electrode 241, a light-emitting layer 242, and a cathode electrode 243.

The anode electrode 241 may be provided or formed on the planarization film 239. The anode electrode 241 may be connected to the source electrode 233 at or through a contact hole penetrating the passivation film 238 and the planarization film 239.

The pixel defining film 244 may be provided or formed to cover the edges of the anode electrode 241 to define a pixel of the display panel 20. That is, the pixel defining film 244 may define a plurality of pixels. Such pixels may be arranged in the display area of the display panel 20, without being limited to the display area. Each of the pixels may be a region in which the anode electrode 241, the light-emitting layer 242, and the cathode electrode 243 are sequentially stacked, and holes from the anode electrode 241 and electrons from the cathode electrode 243 are combined in the light-emitting layer 242 to emit light.

The light-emitting layer 242 may be provided or formed on the anode electrode 241 and the pixel defining film 244. The light-emitting layer 242 may emit one of red light, green light and blue light. Alternatively, the light-emitting layer 242 may be a white light-emitting layer emitting white light. In this case, the light-emitting layer 242 may have a stack of red, green, and blue light-emitting layers and may be a common layer provided or formed in common for all the pixels, and the display panel 20 may further include color filters for respectively displaying red, green, and blue colors.

The light-emitting layer 242 may include a hole transport layer, an emission layer and an electron transport layer. The light-emitting layer 242 may have a tandem structure with two or more stacks, in which case, a charge generating layer may be provided or formed between the stacks.

The cathode electrode 243 may be provided or formed on the light-emitting layer 242. The cathode electrode 243 may be provided or formed to cover the light-emitting layer 242. The cathode electrode 243 may be a common layer provided or formed in common for all pixels.

In a case where the light-emitting element layer is provided or formed as a top emission-type light-emitting element layer that emits light in a direction away from the first substrate 201, e.g., in an upper direction, the anode electrode 241 may include or be formed of a metal material with relatively high reflectance such as a stack of Al and Ti (e.g., Ti/Al/Ti), a stack of Al and indium tin oxide ("ITO") (e.g., ITO/Al/ITO), a silver (Ag)-palladium (Pd)-copper (Cu) ("APC") alloy, or a stack of an APC alloy and ITO (e.g., ITO/APC/ITO), and the cathode electrode 243 may include or be formed of a transparent conductive oxide ("TCO") material such as ITO or indium zinc oxide ("IZO") that can transmit light therethrough or a semi-transmissive conductive material such as magnesium (Mg), Ag, or an alloy thereof. In a case where the cathode electrode 243 includes or is formed of a semi-transmissive conductive material, the emission efficiency of the light-emitting element layer may be improved due to a micro-cavity effect.

In a case where the light-emitting element layer is provided or formed as a bottom emission-type light-emitting element layer that emits light in a downward direction, the anode electrode 241 may include or be formed of a TCO material such as ITO or IZO or a semi-transparent conductive material such as Mg, Ag, or an alloy thereof, and the cathode electrode 243 may include or be formed of a metal material with relatively high reflectance such as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO). In a case where the anode electrode 241 is formed of a semi-transparent conductive material, the emission efficiency of the light-emitting element layer may be improved due to a micro-cavity effect.

The thin-film encapsulation film 205 is provided or formed on the light-emitting element layer. The thin-film encapsulation film 205 reduces or effectively prevents infiltration of oxygen or moisture into the light-emitting layer 242 and the cathode electrode 243. To this end, the thin-film encapsulation film 205 may include at least one inorganic film. The inorganic film may include or be formed of silicon nitride, aluminum nitride, zirconium nitride, titanium nitride, hafnium nitride, tantalum nitride, silicon oxide, aluminum oxide, or titanium oxide. The thin-film encapsulation film 205 may further include at least one organic film. The organic film may be provided or formed to a sufficient thickness to reduce or effectively prevent foreign particles from entering the light-emitting layer 242 and the cathode electrode 243 through the thin-film encapsulation film. The organic film may include one of epoxy, acrylate, and urethane acrylate.

Referring to FIGS. 2 and 5, the display panel 20 may include a protruding area PA in a plan view, which extends further than an edge of the cover window 10. The protruding area PA is provided extending at one side of the display panel 20. A display circuit board 30 and a display driving unit (not illustrated) may be attached to the display panel 20, at the protruding area PA thereof. A first end of the display circuit board 30 may be attached, such as via an anisotropic conductive film (not shown), on pads or terminals of the display panel 20 which are provided in the protruding area PA of the display panel 20. Various electronic signals such as a control signal, a data signal, a driving signal, a power signal, etc. may be transmitted from the display circuit board 30 to the display panel 20 at the pads or terminals thereof. The protruding area PA of the display panel 20 having the display circuit board 30 connected thereto may be bent toward the bottom of the display panel 20.

Specifically, the display panel 20 may include a main region MR and a bending region BR at which the display panel 20 is bendable.

The main region MR may have a similar exterior shape to the display device 1 in a plan view. In an embodiment, the main region MR may be a flat region located in one plane, but the present disclosure is not limited thereto. Alternatively, within the display device 1, at least one edge among all the edges of the main region MR, except for an edge which corresponds to or is connected to the bending region BR, may be curved or bent in a vertical direction instead of being located in one plane.

The bending region BR is connected to the main region MR at one side thereof among sides extended along the first direction (or the X-axis direction). In an embodiment, for example, the bending region BR may be connected to the main region MR at a lower (e.g., relatively short side in FIG. 2) of the main region MR. A width of the main region MR and the bending region BR, may be taken along the first direction (or the X-axis direction). The width of the bending region BR may be less than the width of the main region MR (e.g., the length of the relatively short sides of the main region MR).

At the bending region BR, the display panel 20 may be bent in a downward thickness direction, e.g., in a direction opposite to a display surface, with curvature, or in a direction opposite to the Z-axis direction indicated in FIGS. 1 and 2). The display panel 20 which is bent may dispose the bending region BR to have a uniform curvature radius, but the present disclosure is not limited thereto. Alternatively, the curvature radius of the bending region BR in the display panel 20 which is bent, may vary from one area of the bending region BR to another area of the bending region BR.

As the display panel 20 is bent at the bending region BR, a portion of the display panel 20 may be turned upside down at the bending region BR. Referring to FIGS. 2 and 5, for example, a first surface of the display panel 20, at each of the main region MR, the bending region BR and the protruding area PA, may be disposed upward (e.g., along the Z-axis direction). The display panel 20 which is bent at the bending region BR, disposes a portion of the first surface of the display panel 20 that originally faced upward, facing outward (e.g., in the left direction in FIG. 5) and downward (e.g., in a direction opposite to the Z-axis direction).

A sub-region SR of the display panel 20 extends from the bending region BR. The sub-region SR may define a distal end portion of the display panel 20. The pads or terminals of the display panel 20, which are provided in the protruding area PA of the display panel 20, may be provided at the sub-region SR, without being limited thereto. The sub-region SR may extend from a point where the bending of the display panel 20 is complete relative to a plane in which the main region MR is disposed. The display panel 20 which is bent, disposes the sub-region SR overlapping with the main region MR along the thickness direction of the display panel 20 and/or the display device 1. The display panel 20 which is bent, may dispose the sub-region SR parallel to the main region MR, without being limited thereto. In an embodiment, the first substrate 201 of the display panel 20 may define each of the bending region BR and/or the sub-region SR, without being limited thereto.

The width of the sub-region SR may be the same as the width of the bending region BR, but the present disclosure is not limited thereto. In an embodiment, the bending region BR and the sub-region SR may define the protruding area PA of the display panel 20, without being limited thereto.

A panel bottom member 40 may be disposed below the display panel 20. The panel bottom member 40 may be attached to a rear surface of the display panel 20, such as via an adhesive member. The adhesive member may be a pressure sensitive adhesive ("PSA").

The panel bottom member 40 may include at least one of a light-absorbing member for absorbing incident light from outside the display device 1, a buffer member for absorbing shock from outside the display device 1, a heat dissipation member for effectively releasing heat from the display panel 20 to outside thereof, and a light-shielding layer for blocking incident light from outside the display device 1.

The light-absorbing member within the panel bottom member 40 may be disposed below the display panel 20. The light-absorbing member blocks the transmission of light and thus reduces or effectively prevents the elements disposed therebelow, e.g., the display circuit board, from becoming visible from above the display panel 20 (e.g., a viewing side of the display device 1). The light-absorbing member may include a light-absorbing material such as a black pigment or dye.

The buffer member within the panel bottom member 40 may be disposed below the light-absorbing member. The buffer member absorbs external shock and thus reduces or effectively prevents the display panel 20 from being damaged. The buffer member may be provided or formed as a single layer or as multiple layers. In an embodiment, for example, the buffer member may include a polymer resin such as polyurethane, polycarbonate, polypropylene, or polyethylene or an elastic material such as a sponge obtained by foam-molding rubber, a urethane-based material or an acrylic material. The buffer member may be a cushion layer.

The heat dissipation member within the panel bottom member 40 may be disposed below the buffer member. The heat dissipation member may include a first heat dissipation layer including graphite or carbon nanotubes and a second heat dissipation layer provided or formed as a relatively thin metal film using a metal capable of shielding electromagnetic waves and having excellent thermal conductivity such as Cu, nickel (Ni), ferrite, or Ag.

The display circuit board 30 may be attached to the bottom of the panel bottom member 40. The display circuit board 30 may be attached to ae bottom surface of the panel bottom member 40, such as via an adhesive member. The adhesive member may be a PSA. A bonding force between the display circuit board 30 and the PSA can be improved by increasing a contact area of the display circuit board 30 and the PSA. As a result of the improved bonding force, adhesion defects or peeling defects that may occur in connection with process automation can be reduced or effectively prevented. This will be described later in detail.

Referring again to FIGS. 2 and 5, a middle frame 50 may be disposed below the panel bottom member 40 which is attached to the display panel 20 having the cover window 10 thereon. The middle frame 50 may include plastic, a metal, or both.

The middle frame 50 may include holes defined therein, in which components such as a camera device, a battery and a cable may be disposed or pass through.

A main circuit board 60 may be disposed below the middle frame 50. The main circuit board 60 may be a printed circuit board ("PCB") or a flexible PCB ("FPCB").

The main circuit board 60 may include a main processor (not illustrated) which controls the functions of the display device 1 and/or a component thereof such as a camera device (not illustrated).

A mobile communication module, which can exchange wireless signals with at least one of a base station, an external terminal and a server via a mobile communication network, may be further provided on the main circuit board 60. The wireless signals may include various types of data associated with the transmission/reception of audio signals, video call signals and/or text/multimedia messages.

A lower cover 70 may be disposed below the middle frame 50 and the main circuit board 60. The lower cover 70 may be coupled and fixed to the middle frame 50. The lower cover 70 may form the bottom exterior of the display device 1. The lower cover 70 may include plastic and/or a metal.

A camera hole in which the camera device is inserted may be provided or formed in the lower cover 70. The camera device which is inserted into the camera hole may dispose a portion of the camera device to protrude or be exposed outside the display device 1.

Figure 6:
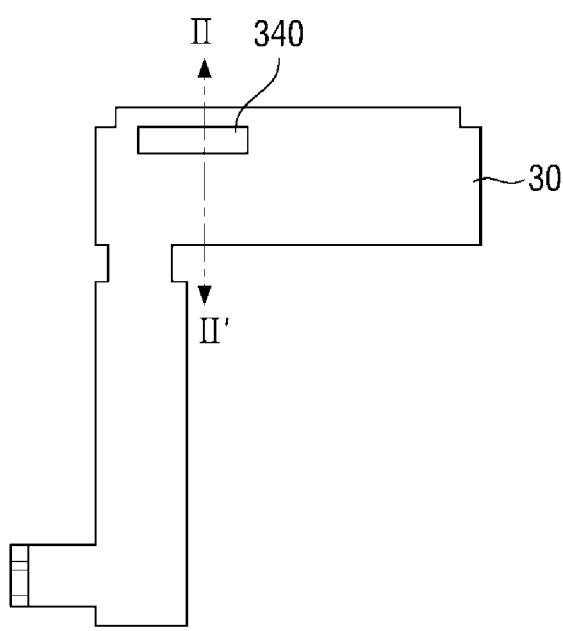
FIG. 6 is a plan view illustrating an embodiment a display circuit board of FIG. 2.
Figure 7:
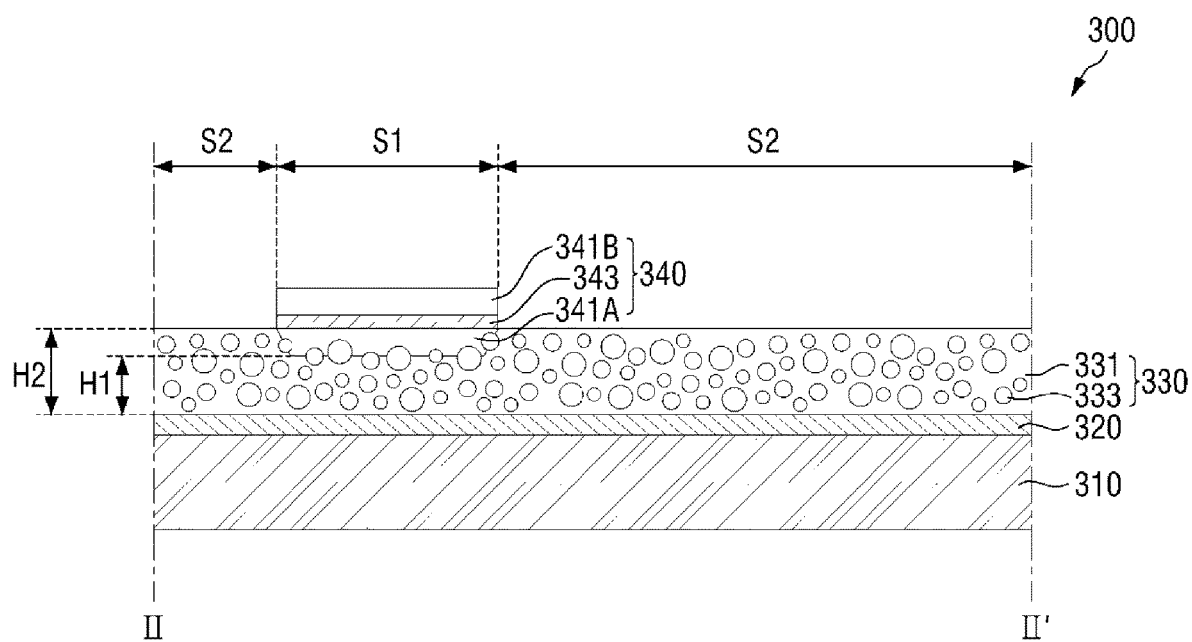
FIG. 7 is an enlarged cross-sectional view, taken along line II-II' of FIG. 6.

The display circuit board 30 will hereinafter be described. FIG. 6 is a plan view illustrating an embodiment of the display circuit board of FIG. 2. FIG. 7 is an enlarged cross-sectional view, taken along line II-II' of FIG. 6.

Referring to FIGS. 6 and 7, the display circuit board 30 may be an FPCB. The display circuit board 30 will hereinafter be described as being an FPCB 300.

The FPCB 300 may include a base film 310, a conductive layer 320 which is disposed on the base film 310, a passivation layer 330 which is disposed on the conductive layer 320, and a first adhesive 340 which is disposed on the passivation layer 330. The passivation layer 330 defines an outer surface of the FPCB 300 to which a target object such as the display panel 20 is attachable.

The base film 310 may include or be formed of, for example, a flexible insulating material such as PI.

The conductive layer 320 may be disposed on the base film 310. The conductive layer 320 may form or define pads or terminals of the display circuit board 30, together with a plurality of electrical signal wires thereof. The conductive layer 320 may include or be formed of a metal material such as Cu.

The passivation layer 330 may serve as an insulating member between electrical circuitry and a passivation member for protecting circuit patterns within the FPCB 300. Such circuit patterns may be connected to conductive elements of the display panel 20, such as terminals or pads, signal line, etc. The passivation layer 330 may include a resin layer 331 and a filler 333 provided in plurality (e.g., fillers 333) which is dispersed in the resin layer 331. Since the fillers 333 are dispersed in the resin layer 331, the mechanical properties of the passivation layer 330 can be improved.

The resin layer 331 may include a thermosetting compound. The resin layer 331 may include an organic material. The thermosetting compound may be an epoxy resin, and the epoxy resin may be selected from a naphthalene-based epoxy resin, a naphthol/phenol-based epoxy resin, an olefin-based epoxy resin, a cresol novolac epoxy resin, a bisphenol A epoxy resin, a diglycidyl ether of bisphenol A (DGEBA)-based epoxy resin, a diglycidyl ether of bisphenol F (DGEBF)-based epoxy resin, and a rubber modified epoxy resin.

The fillers 333 may include an inorganic material. In an embodiment, for example, the fillers 333 may be selected from silica, alumina, barium sulfate, talc, clay, mica powder, aluminum hydroxide, magnesium hydroxide, calcium carbonate, magnesium carbonate, magnesium oxide, boron nitride, aluminum borate, barium calcium titanate, magnesium titanate, bismuth titanate, titanium carbonate, titanium oxide, barium titanate, zircon, and calcium zirconate. The fillers 333 may include or be formed of one of the materials listed above, and at least two of fillers 333 may be used in combination.

The fillers 333 may be included in the passivation layer 330 at an amount of about 50 parts by weight to about 80 parts by weight, relative to a total weight of the passivation layer 330. When the content of the fillers 333 is less than about 50 parts by weight, the hardness of the passivation layer 330 provided or formed from the resin layer 331 may decrease. When the content of the fillers 333 is more than about 80 parts by weight, the flowability of the resin layer 331 may decrease, and as a result, the flatness and the uniformity of the passivation layer 330, which includes the resin layer 331, may deteriorate. Accordingly, the bonding force between the passivation layer 330 and elements attached to the FPCB 300 at the passivation layer 330, such as, for example, the panel bottom member 40, may be lowered.

The passivation layer 330 may include a first region S1 and a second region S2 as a remaining region of the passivation layer 330, except for the first region S1. That is, the second region S2 may correspond to an entirety of an outer surface of the passivation layer 330, except for the outer surface in the first region S1.

The first region S1 of the passivation layer 330 may include a depression which is recessed from the second region S2, e.g., recessed from the top surface of the passivation layer 330 which is defined at the second region S2. The top surface of the passivation layer 330 defines an outer surface of the FPCB 300, and the outer surface is disposed at both the first region S1 and the second region S1. The first region S1 may be a planar area of the passivation layer 330 at which the first adhesive 340 is attachable. The first region S1 may be a planar area at which the passivation layer 330 (or the FPCB 300) is attachable to the rear surface of the display panel 20. This will be described later in detail.

The depression at the first region S1 may include or be defined by a bottom surface which is located at the center of the first region S1 and side surfaces which extend from the bottom surface and to the top surface at the second region S2, to effectively surround the bottom surface in a plan view. That is, the depression is defined by the bottom surface and the side surfaces which connect the bottom surface and the outer surface at the second region S2 to each other. The side surfaces of the depression at the first region S1 may have a predetermined inclination angle with respect to the top surface of the second region S2 and may connect the bottom surface of the depression at the first region S1 and a top surface of the passivation layer 330 at the second region S2 to each other. The bottom and side surfaces at the depression, together with the top surface at the second region S2, may define an overall top surface (or outer surface) of the passivation layer 330.

The second region S2 may account for an entirety of a planar area of the passivation layer 330 except for a planar area defined by the first region S1. The second region S2 at which the first adhesive 340 is omitted, may be exposed from the first adhesive 340, to outside the passivation layer 330 (or outside the FPCB 300).

The first region S1 may partially overlap with the first adhesive 340 in the plan view. The passivation layer 330 at the first region S1 thereof, may be in direct contact with the first adhesive 340. An overlapping area of the first adhesive 340 and the first region S1 of the passivation layer 330 is larger than an overlapping area of the first adhesive 340 and the second region S2 of the passivation layer 330.

The passivation layer 330 at the first region S1 thereof, may include the fillers 333 that are projected beyond a surface of the resin layer 331. The fillers 333 may be projected further than the resin layer 331 at each of the bottom surface and the side surfaces of the depression. The number of fillers 333 within the depression at the first region S1, that are exposed outside of the resin layer 331, may be greater than the number of fillers 333 at the second region S2 which are exposed outside of the resin layer 331. Attachment of the first adhesive 340 at the first region S1 of the passivation layer 330 disposes the first adhesive 340 in contact with both the resin layer 331 and with the fillers 333 which are exposed outside of the resin layer 331.

The passivation layer 330 at the first region S1 may have a predetermined surface roughness. The surface roughness at the first region S1 may be defined by the fillers 333 within the depression at the first region S1, that are exposed outside of the resin layer 331. The surface roughness at the first region S1 may be provided or formed by plasma etching treatment. The surface roughness at the first region S1 may be greater than the surface roughness at the second region S2. Only the first region S1 may be provided or formed to have a surface roughness, and essentially no surface roughness may be provided or formed in the second region S2 (e.g., totally smooth or flat). Also, the surface roughness at the first region S1 may vary from one portion to another portion of the first region S1. In an embodiment, for example, the surface roughness at the bottom surface of the depression within the first region S1 may be greater than the surface roughness at the side surfaces of the depression within the first region S1.

As described above, since the fillers 333 protrude further from the resin layer 331 at the first region S1 to increase a surface area and surface roughness of the passivation layer 330 at the first region S1, the adhesive strength of an adhesive attached to the first region S1 of the passivation layer 330 can be improved, particularly at the interface between the adhesive and the first region S1 of the passivation layer 330. Specifically, in a case where an adhesive is attached to a same planar area of the first region S1 and the second region S2, an actual contact area of the first region S1 and the adhesive may be larger than an actual contact area of the second region S2 and the adhesive, owing to the increase surface area provided by the depression at the first region S1. That is, the adhesive strength between the first region S1 and the adhesive may be greater than the adhesive strength between the second region S2 and the adhesive. In this case, the adhesive can be more easily detached from the second region S2 than from the first region S1.

The passivation layer 330 may have a first thickness H1 and a second thickness H2.

The bottom surface of the depression at the first region S1 may be a portion of the overall top surface of the passivation layer 330, which is closest to the base film. The first thickness H1 may be defined as the shortest distance between the overall top surface of the passivation layer and the bottom surface of the passivation layer 330.

The second thickness H2 may be defined as the shortest distance between the lowest point of the second region S2 of the passivation layer 330 and the bottom surface of the passivation layer 330. In other words, the second thickness H2 may be a longest distance between the bottom surface and the overall top surface of the passivation layer 330.

The first thickness H1 may be less than the second thickness H2. An average thickness of the passivation layer 330 at the first region S1 (e.g., the first thickness H1) may be less than an average thickness of the passivation layer 330 at the second region S2 (e.g., the second thickness H2).

The depth of the depression at the first region S1 of the passivation layer 330 may be expressed as the difference between the first thickness H1 and the second thickness H2, that is, H2 minus H1 (e.g., H2-H1).

The first adhesive 340 may be disposed on the passivation layer 330. Specifically, the first adhesive 340 may be disposed in the first region S1 of the passivation layer 330. The first adhesive 340 may at least partially overlap with, and may be in direct contact with, the first region S1 of the passivation layer 330. FIG. 7 illustrates that side surfaces of the first adhesive 340 are aligned with the side surfaces of the depression at the first region S1, but the present disclosure is not limited thereto. Alternatively, the side surfaces of the first adhesive 340 may be inside of the first region S1 to have a smaller planar dimension than the first region S1, in which case, portions of the passivation layer 330 (e.g., at the depression) may be exposed from the first adhesive 340.

The first adhesive 340 may include a first adhesive layer 341A, a first base layer 343 which is disposed on the first adhesive layer 341A, and a second adhesive layer 341B which is disposed on the first base layer 343.

The first adhesive layer 341A may be disposed between the passivation layer 330 and the first base layer 343. A first surface of the first adhesive layer 341A may be in direct contact with the passivation layer 330, and a second surface of the first adhesive layer 341A which is opposite to the first surface thereof may be in direct contact with a first surface of the first base layer 343. Specifically, the first surface of the first adhesive layer 341A may be in direct contact with the first region S1 of the passivation layer 330. Also, the first surface of the first adhesive layer 341A may be in direct contact not only with the resin layer 331 in the first region S1, but also with the fillers 333 that are projected from the resin layer 331 in the first region S1.

The second adhesive layer 341B may be disposed on the first base layer 343, and a first release layer 360A (FIGS. 15 and 16) may be removably disposable on the second adhesive layer 341B. A first surface of the second adhesive layer 341B may be in direct contact with a second surface of the first base layer 343 which is opposite to the first surface thereof, and a second surface of the second adhesive layer 341B may be in direct contact with a first surface of the first release layer 360A. The first release layer 360A, which is removably disposable on the second adhesive layer 341B, may be removed during an assembly process of the FPCB 300, and then, a target object may be attached to the FPCB 300 such as being contacted with the second adhesive layer 341B from which the first release layer 360A is removed. In an embodiment, for example, once the first release layer 360A is removed, the second surface of the second adhesive layer 341B may be in contact with the rear surface of the display panel 20, but the present disclosure is limited thereto. In a case where the panel bottom member 40 or the like is provided at the bottom of the display panel 20, the second surface of the second adhesive layer 341B from which the first release layer 360A is removed may be in contact with the panel bottom member 40. Accordingly, the FPCB 300 can be coupled to the display panel 20 or to the panel bottom member 40 via the second adhesive layer 341B.

The first adhesive layer 341A and/or the second adhesive layer 341B may include an acrylic resin or a silicone resin. The first adhesive layer 341A and the second adhesive layer 341B may include or be formed of the same material.

The first adhesive layer 341A and the second adhesive layer 341B may have different adhesive strengths from each other. Specifically, the adhesive strength of the first adhesive layer 341A may be greater than the adhesive strength of the second adhesive layer 341B. Accordingly, the bonding force between the first adhesive layer 341A and the passivation layer 330 may be stronger than the bonding force between the second adhesive layer 341B and the first release layer 360A. As a result, even if the first release layer 360A is removed from the second adhesive layer 341B during an assembly process, removal of the first adhesive layer 341A from the passivation layer 330 can be reduced or effectively prevented.

The first base layer 343 may be disposed between the first adhesive layer 341A and the second adhesive layer 341B. The first surface of the first base layer 343 may be in direct contact with the second surface of the first adhesive layer 341A, and a second surface of the first base layer 343 may be in direct contact with the first surface of the second adhesive layer 341B.

The first base layer 343 may be provided as a supporting layer for the first adhesive 340.

The first base layer 343 may include a film of a transparent material such as PET, thermoplastic polyurethane ("TPU"), PC, polyvinylchloride ("PVC"), or polypropylene ("PP").

FIG. 7 illustrates that the first base layer 343 is disposed between the first adhesive layer 341A and the second adhesive layer 341B, but the present disclosure is not limited thereto. Alternatively, the first base layer 343 may not be provided between the first adhesive layer 341A and the second adhesive layer 341B, and an intermediate adhesive layer may be provided instead.

As described above, an increased surface roughness can be imparted only to the first region S1 of the passivation layer 330 without affecting other regions of the passivation layer 330.

Also, since an increased surface roughness is provided or formed in the first region S1 of the passivation layer 330, the contact area of the first region S1 and the first adhesive 340 can be enlarged, and as a result, the adhesive strength between the first region S1 of the passivation layer 330 and the first adhesive 340 can be improved. Accordingly, adhesion defects or peeling defects that may occur in connection with process automation in assembling the FPCB 300 to a target object can be reduced or effectively prevented.

Figure 8:
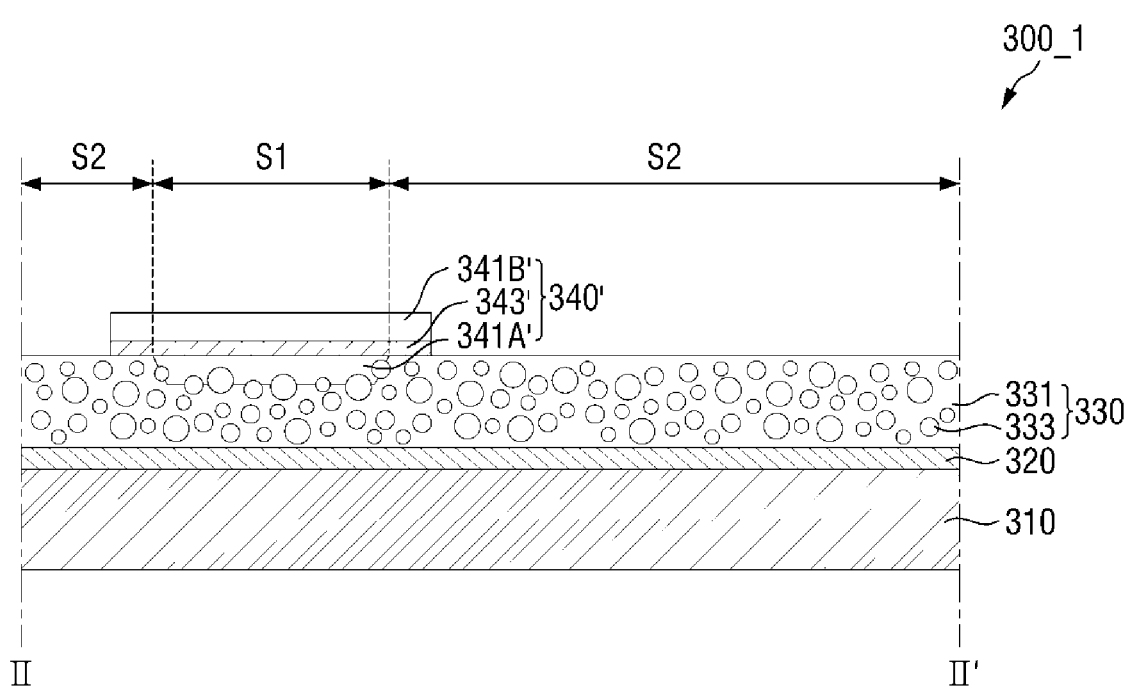
FIG. 8 is an enlarged cross-sectional view of another embodiment of a display circuit board.

A modified embodiment of an FPCB will hereinafter be described. In FIGS. 7 and 8, like reference numerals indicate like elements throughout the present disclosure, and descriptions thereof will be omitted or at least simplified.

FIG. 8 is an enlarged cross-sectional view of another embodiment of the display circuit board 30.

Referring to FIG. 8, an FPCB 300_1 differs from the FPCB 300 of FIG. 7 in that a first adhesive 340' partially overlaps with a second region S2 of a passivation layer 330.

Specifically, in a plan view, a planar dimension of the first adhesive 340' may be larger than a planar dimension of a first region S1 of the passivation layer 330. Thus, the first adhesive 340' may be disposed to completely cover the first region S1 of the passivation layer 330, and extend further than the first region S1 to be disposed in the second region S2. That is, an overlapping area of the first adhesive 340' and the first region S1 of the passivation layer 330 is larger than an overlapping area of the first adhesive 340' and the second region S2 of the passivation layer 330.

The first adhesive 340' may be in contact with the first region S1 and the second region S2 of the passivation layer 330. A total contact area of the first adhesive 340' and the passivation layer 330 at the first region S1 may be larger than a total contact area of the first adhesive 340' and the passivation layer 330 at the second region S2.

FIG. 8 illustrates that a base layer 343' of the first adhesive 340' is disposed outside of the passivation layer 330 to be in contact with the second region S2 of the passivation layer 330, but the present disclosure is not limited thereto. That is, in a case where a first adhesive layer 341A' of the first adhesive 340' is provided or formed to be thicker than the depth of the depression at the first region S1 of the passivation layer 330, e.g., greater than H2-H1, the first adhesive layer 341A' may extend outside of the depression to be in contact with the second region S2 of the passivation layer 330.

As similarly shown in FIG. 7, edges of a second adhesive layer 341B' shown in FIG. 8 may correspond to edges of the base layer 343', without being limited thereto.

Surface roughness can be imparted only to the first region S1 of the passivation layer 330 without affecting other regions of the passivation layer 330. Also, as described above, since surface roughness is provided or formed in the first region S1 of the passivation layer 330, the adhesive strength between the first region S1 and the first adhesive 340' can be improved, and as a result, adhesion defects or peeling defects that may occur in connection with process automation can be prevented.

A method of manufacturing an FPCB, particularly, a method of manufacturing the FPCB 300 of FIGS. 1 through 7, will hereinafter be described. In FIGS. 1 through 7 and 9, like reference numerals indicate like elements throughout the present disclosure, and descriptions thereof will be omitted or at least simplified.

Figure 9:
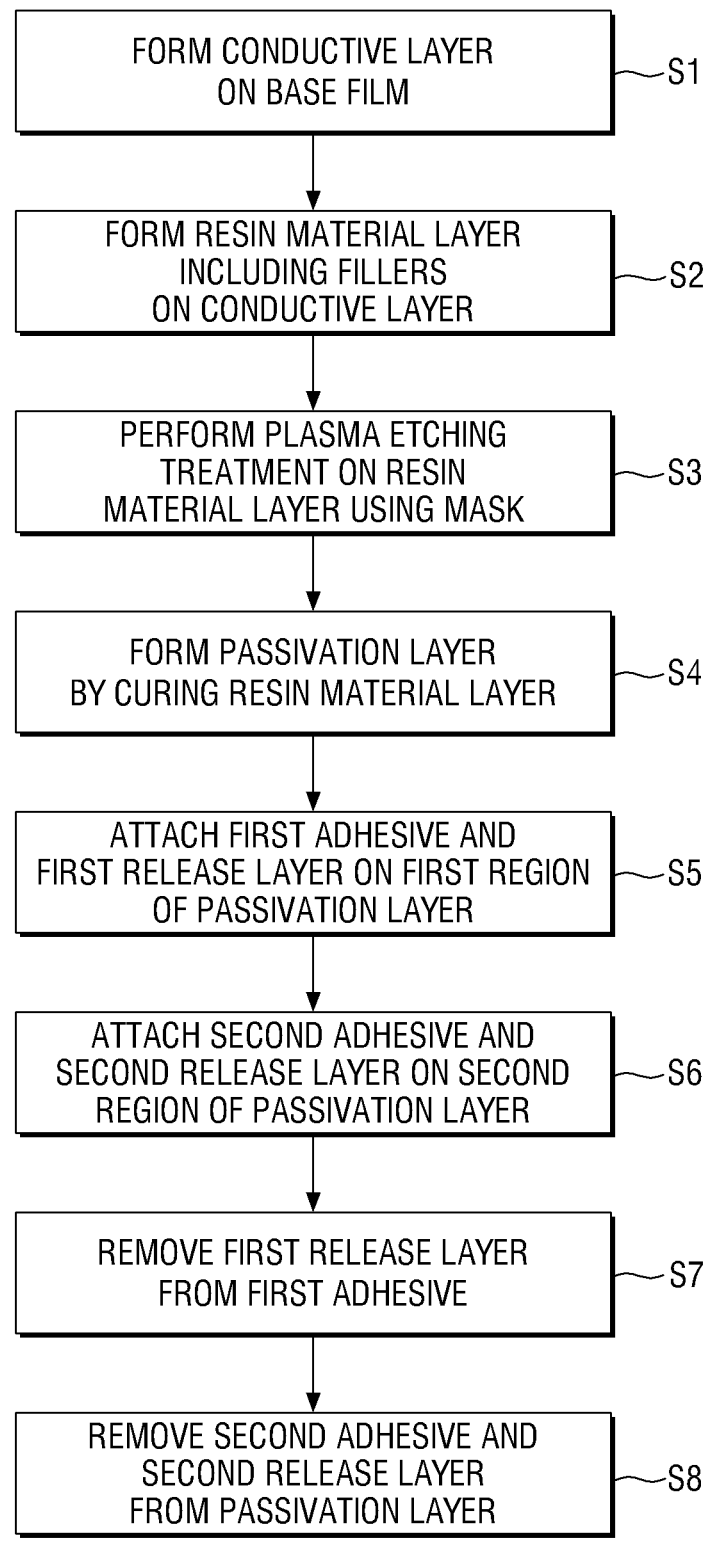
FIG. 9 is a flowchart illustrating an embodiment of a method of manufacturing a display circuit board.

FIG. 9 is a flowchart illustrating an embodiment of a method of manufacturing an FPCB. FIGS. 10 through 17 are cross-sectional views illustrating embodiments of respective structures in processes of the method of manufacturing an FPCB. FIGS. 10 through 17 are cross-sectional views taken along line II-II' of FIG. 6.

Referring to FIG. 9, the method of manufacturing an FPCB may include: providing or forming a conductive layer on a base film (S1); providing or forming a resin material layer including fillers on the conductive layer (S2); performing plasma etching treatment on the resin material layer using a mask (S3); providing or forming a passivation layer by curing the resin material layer (S4); attaching a first adhesive and a first release layer on a first region of the passivation layer (S5); attaching a second adhesive and a second release layer on a second region of the passivation layer (S6); removing the first release layer from the first adhesive (S7); and removing the second adhesive and the second release layer from the passivation layer (S8).

Figure 10:
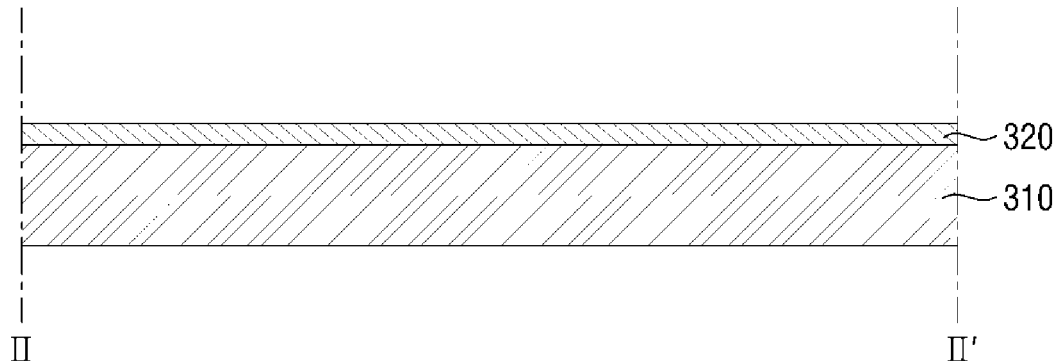
FIGS. 10 through 17 are cross-sectional views illustrating embodiments of respective structures in process of the method of manufacturing a display circuit board.

Referring to FIGS. 9 and 10, a conductive layer 320 is provided or formed on a base film 310 (S1). The conductive layer 320 may include or be formed of a metal material such as Cu and may form circuit patterns of the FPCB 300 on the base film 310 thereof.

Figure 11:
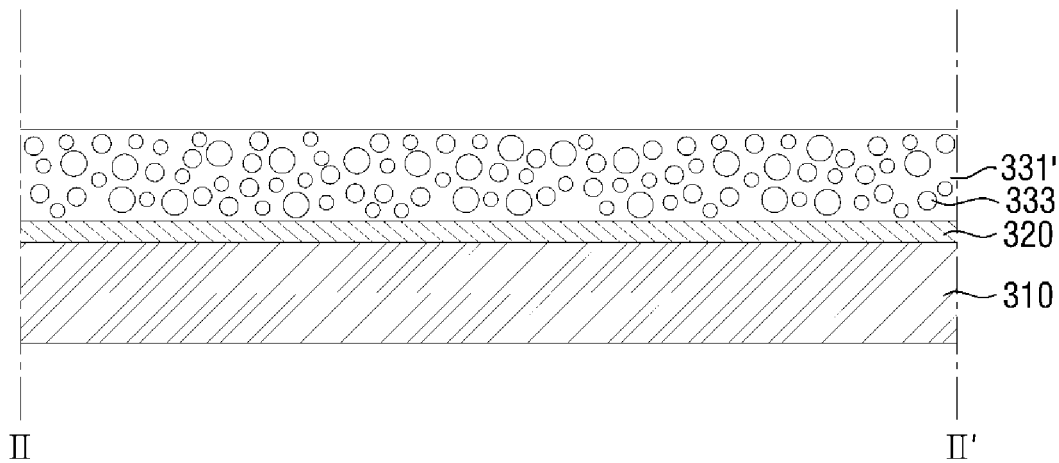

Thereafter, referring to FIGS. 9 and 11, a resin material layer 331' including fillers 333 is provided or formed on the conductive layer 320 (S2). Specifically, the resin material layer 331', which is in a semi-cured state (e.g., semi-cured resin material layer 331'), is provided or formed by applying and drying a resin material. The resin material may be applied using at least one of screen printing, roll coating, curtain coating and spray coating. The resin material layer 331' may include a thermosetting compound such as an epoxy resin. The resin material layer 331' including the fillers 333 defines an inner surface facing the conductive layer 320 and an outer surface which is opposite to the inner surface.

Figure 12:
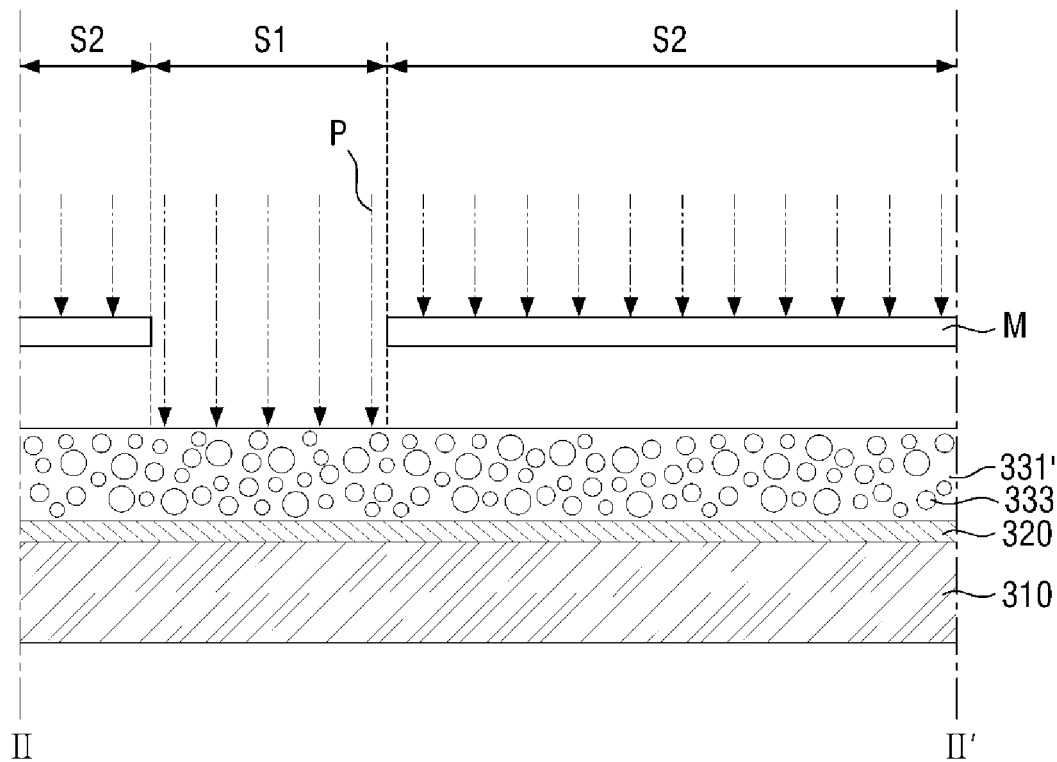

Thereafter, referring to FIGS. 9 and 12, a plasma etching treatment process P (e.g., plasma-etching) is performed on the resin material layer 331' using a mask M (S3).

The plasma etching treatment process P may be performed using a plasma-generating gas including $O_2$ or $CF_4$. The surface roughness of the resin material layer 331' may be controlled depending on the composition ratio of the plasma-generating gas.

The first region S1 of the resin material layer 331' is exposed to the plasma etching treatment process P using the mask M, and the plasma etching treatment process P is performed while the second region S2 is being masked therefrom. As a result, the first region S1 of the resin material layer 331' may be selectively etched by the plasma etching treatment process P. In this case, surface roughness is imparted to an outer surface of the resin material layer 331' in the first region S1 through the plasma etching treatment process P, while an inner surface of the resin material layer 331' faces the conductive layer 320. Specifically, as the first region S1 of the resin material layer 331' is etched, the fillers 333 dispersed in the resin material layer 331' at the first region S1 may be exposed outside of the resin material layer 331' in the first region S1. At the first region S1, a total thickness of the resin material layer 331' having the fillers 333 dispersed therein, is reduced by the plasma etching treatment process P. Such reduction in total thickness, forms a depression of the resin material layer 331' at the first region S1, and the fillers 333 at the depression are projected outside of the resin material layer 331'.

As described above, since the fillers 333 are projected outside of the resin material layer 331' in the first region S1, the surface area of the resin material layer 331' at the first region S1 can be enlarged. Since surface roughness of the resin material layer 331' is provided or formed in the first region S1, the adhesive strength of the resin material layer 331' at the interface between the first region S1 relative to an adhesive can be increased and improved. Specifically, in a case where an adhesive is attached on the resin material layer 331' at the first region S1 and the second region S2, the contact area of the resin material layer 331' at the first region S1 and the adhesive may be larger than the contact area of the resin material layer 331' at the second region S2 and the adhesive. That is, the adhesive strength between the resin material layer 331' at the first region S1 and the adhesive may be greater than the adhesive strength between the resin material layer 331' at the second region S2 and the adhesive. In this case, the adhesive can be more easily detached from the resin material layer 331' at the second region S2 than from the resin material layer 331' at the first region S1.

Figure 13:
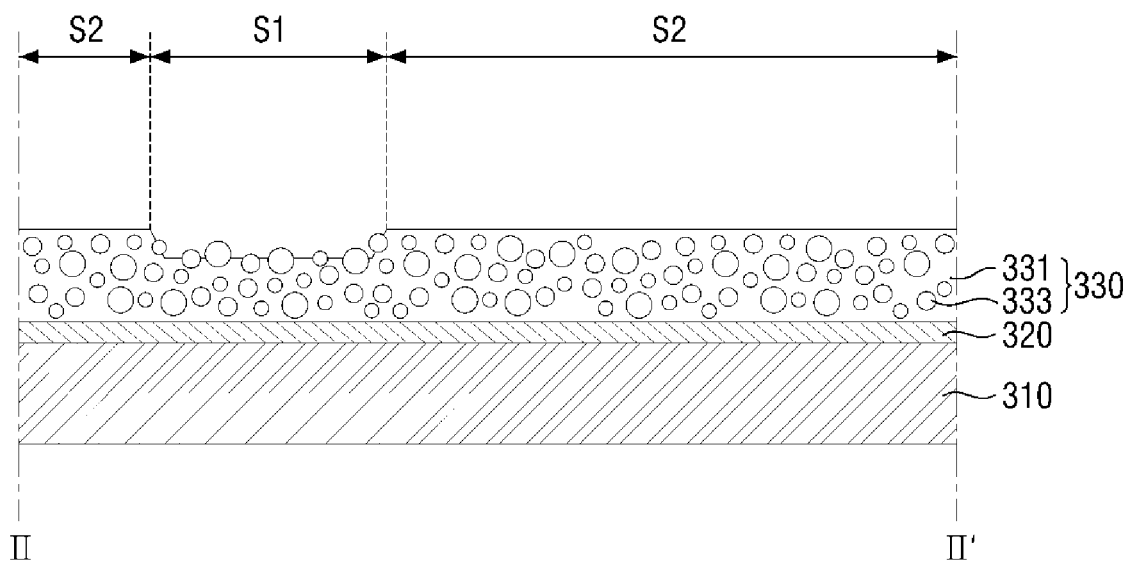

Thereafter, referring to FIGS. 9 and 13, a passivation layer 330 (e.g., cured passivation layer 330) is provided or formed by curing the resin material layer 331' having the fillers 333 dispersed therein (S4). The resin material layer 331' may be thermally or optically cured. Although not specifically illustrated, before the formation of the passivation layer 330 by curing the resin material layer 331', processes such as providing or forming a via hole and the like in the resin material layer 331' may be performed.

The curing of the resin material layer 331' provides the resin layer 331 of the passivation layer 330 including a first region S1 which has been plasma-etched, from the first region S1 of the resin material layer 331' which has been plasma-etched, and a second region S2 from the second region S2 of the resin material layer 331'. That is, the first region S1 and the second region S2 of the passivation layer 330 respectively correspond to and are provided from the first region S1 and the second region S2 of the resin material layer 331' described above.

Figure 14:
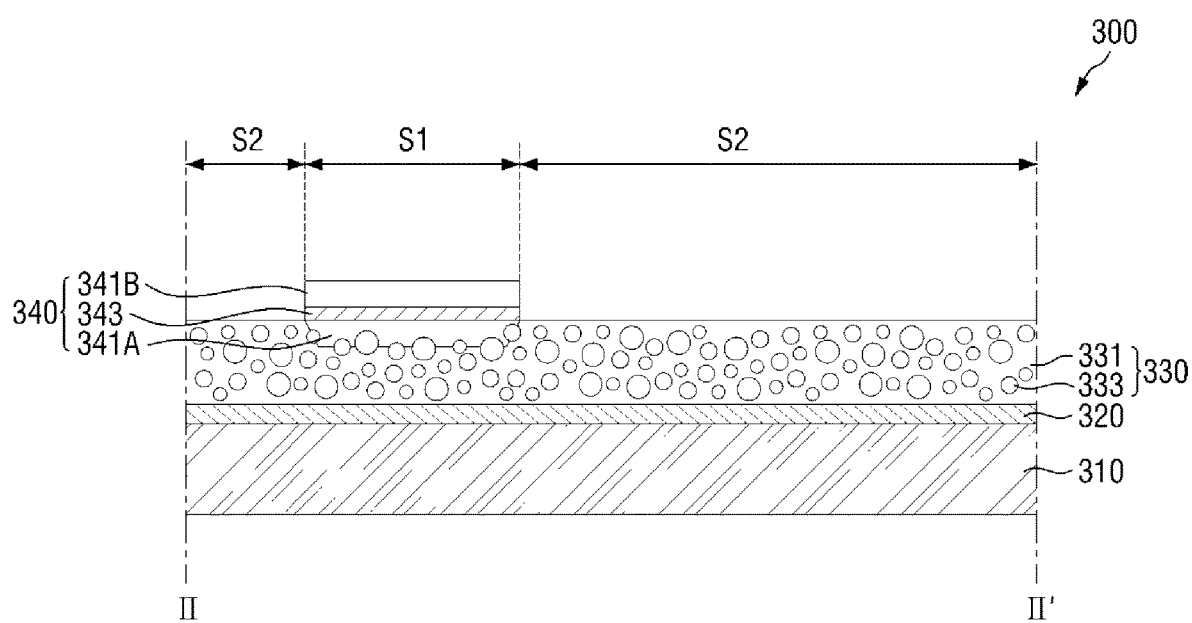

Thereafter, referring to FIGS. 9 and 14, a first adhesive 340 and a first release layer 360A are attached to the passivation layer 330 at a first region S1 of the passivation layer 330 (S5). A silicone-based, PET-based, or paper-based film may be used as the first release layer 360A.

As described above, as a result of the plasma etching treatment process P, the fillers 333 are projected from the resin layer 331 at the first region S1, and thus, the first adhesive 340 can have an improved adhesive strength with the passivation layer 330 at the first region S1.

Figure 15:
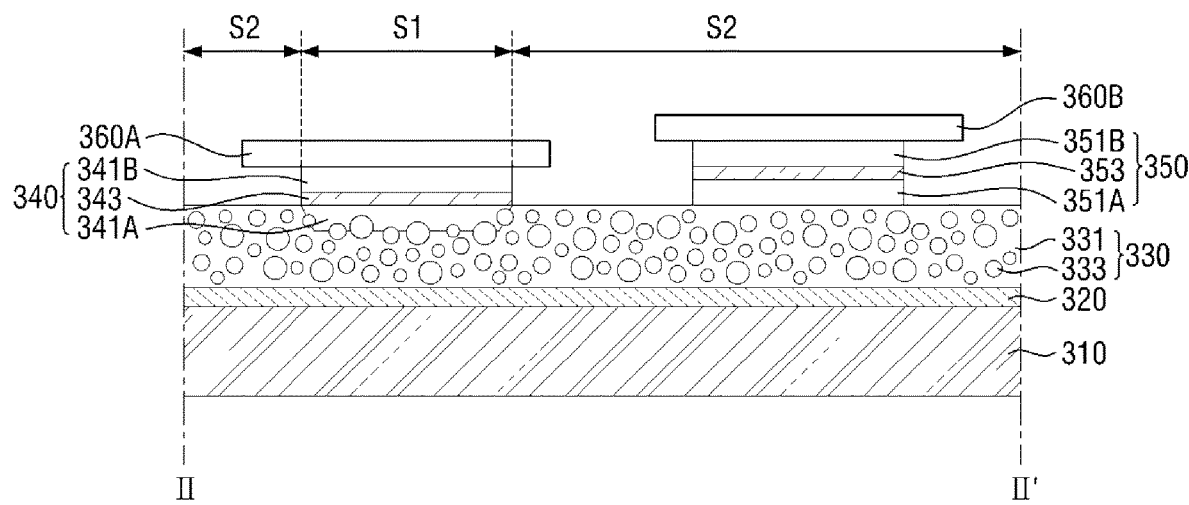

Thereafter, referring to FIGS. 9 and 15, a second adhesive 350 and a second release layer 360B are attached to the passivation layer 330 at a second region S2 of the passivation layer 330 (S6). The second adhesive 350 and the second release layer 360B may be provided on an entirety of the second region S2 except for the first region S1, without being limited thereto. Since the second adhesive 350 is attached to the passivation layer 330 at the second region S2 in which the fillers 333 are not projected outside of the resin layer 331, the adhesive strength between the second adhesive 350 and the passivation layer 330 at the second region S2 thereof may be less than the adhesive strength between the first adhesive 340 and the passivation layer 330 at the first region S1 thereof. Accordingly, the second adhesive 350 can be relatively easily peeled off of, and removed from, the passivation layer 330 after an assembly process which uses the second adhesive 350. That is, the second adhesive 350 is removably disposed on the passivation layer 330, particularly, at the second region S2 thereof.

The second adhesive 350 may include a third adhesive layer 351A, a second base layer 353 which is disposed on the third adhesive layer 351A, and a fourth adhesive layer 351B which is disposed on the second base layer 353.

The third adhesive layer 351A may be disposed between the passivation layer 330 and the second base layer 353. A first surface of the third adhesive layer 351A may be in direct contact with the passivation layer 330, and a second surface of the third adhesive layer 351A may be in direct contact with a first surface of the second base layer 353. Specifically, the first surface of the third adhesive layer 351A may be in direct contact with the second region S2 of the passivation layer 330. Also, the first surface of the third adhesive layer 351A may be in direct contact with the resin layer 331 in the second region S2, but not with the fillers 333 of the passivation layer 330 at the second region S2.

The fourth adhesive layer 351B may be disposed on the second base layer 353, and the second release layer 360B may be disposed on the fourth adhesive layer 351B. A first surface of the fourth adhesive layer 351B may be in direct contact with the second surface of the second base layer 353, and a second surface of the fourth adhesive layer 351B may be in direct contact with a first surface of the second release layer 360B.

The third adhesive layer 351A and/or the fourth adhesive layer 351B may include an acrylic resin or a silicone resin. The third adhesive layer 351A and the fourth adhesive layer 351B may include or be formed of the same material.

The third adhesive layer 351A and the fourth adhesive layer 351B may have different adhesive strengths from each other. Specifically, the adhesive strength of the third adhesive layer 351A may be less than the adhesive strength of the fourth adhesive layer 351B. Accordingly, a bonding force between the third adhesive layer 351A and the passivation layer 330 may be weaker than the bonding force between the fourth adhesive layer 351B and the first release layer 360A.

Also, the adhesive strength of the first adhesive layer 341A may be greater than the adhesive strength of the third adhesive layer 351A. Also, the adhesive strength of the second adhesive layer 341B may be less than the adhesive strength of the fourth adhesive layer 351B.

The second base layer 353 may be disposed between the third adhesive layer 351A and the fourth adhesive layer 351B. The first surface of the second base layer 353 may be in direct contact with the second surface of the third adhesive layer 351A, and a second surface of the second base layer 353 may be in direct contact with the first surface of the fourth adhesive layer 351B.

The second base layer 353 may be provided as a supporting layer for the second adhesive 350.

The second base layer 353 may include a film of a transparent material such as PET, TPU, PC, PVC, or PP.

The second base layer 353 may include the same material as the first base layer 343. The second base layer 353 may be substantially the same as the first base layer 343.

A silicone-based, PET-based, or paper-based film may be used as the second release layer 360B. The second release layer 360B may include the same material as the first release layer 360A. The second release layer 360B may be substantially the same as the first release layer 360A.

Figure 16:
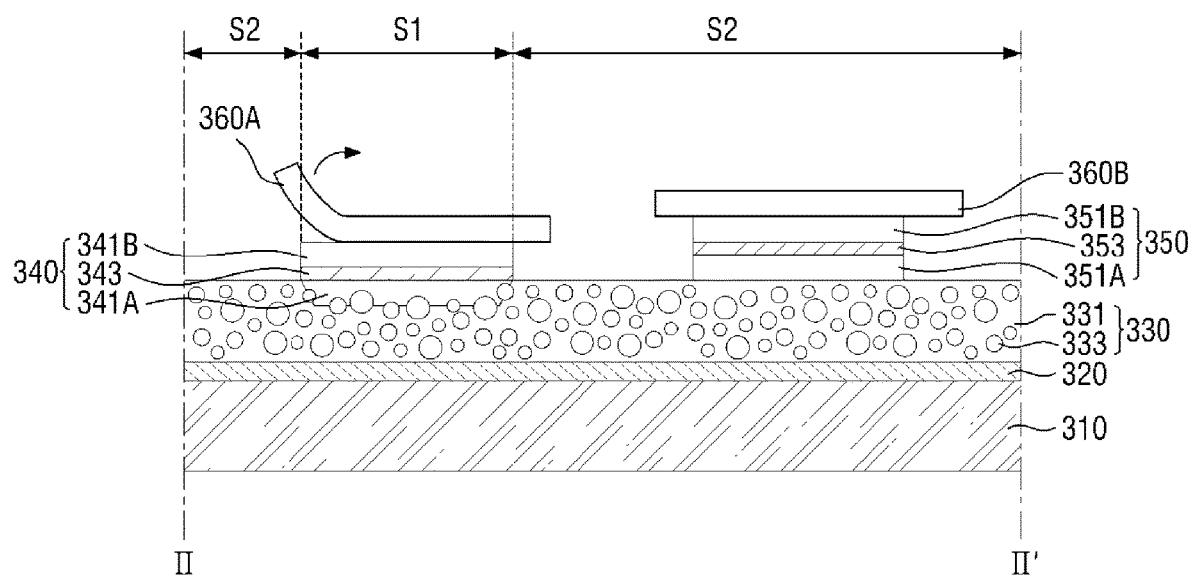

Thereafter, referring to FIGS. 9 and 16, the first release layer 360A is removed from the first adhesive 340 (S7). That is, the first release layer 360A is removably disposed on the first adhesive 340. As described above, since the first adhesive 340 is in contact with the passivation layer 330 at the first region S1 that has been subjected to the plasma etching treatment process P, the first adhesive 340 can be relatively strongly coupled to the passivation layer 330 at the first region S1 thereof. Thus, even if the first release layer 360A is removed from the first adhesive 340, peeling of the first adhesive 340 from the passivation layer 330 can be reduced or effectively prevented.

In addition, since the adhesive strength of the first adhesive layer 341A is greater than the adhesive strength of the second adhesive layer 341B, the bonding force between the first adhesive layer 341A and the passivation layer 330 may be stronger than the bonding force between the second adhesive layer 341B and the first release layer 360A. Accordingly, the first release layer 360A can be relatively easily removed while peeling of the first adhesive 340 from the passivation layer 330 is reduced or effectively prevented.

Once the first release layer 360A is removed from the first adhesive 340, a target object may be contacted with the second adhesive layer 341B. In an embodiment, for example, the second surface of the second adhesive layer 341B from which the first release layer 360A is removed may be contacted with the rear surface of the display panel 20 as the target object, but the present disclosure is not limited thereto. Alternatively, in a case where the panel bottom member 40 or the like is provided at the bottom of the display panel 20, the second surface of the second adhesive layer 341B may be contacted with the panel bottom member 40 as the target object. Accordingly, the FPCB 300 can be coupled to the display panel 20 or to the panel bottom member 40 via the second adhesive layer 341B which is exposed by removing of the first release layer 360A. That is, the first adhesive 340 may serve as an adhesive for bonding elements to each other.

Figure 17:
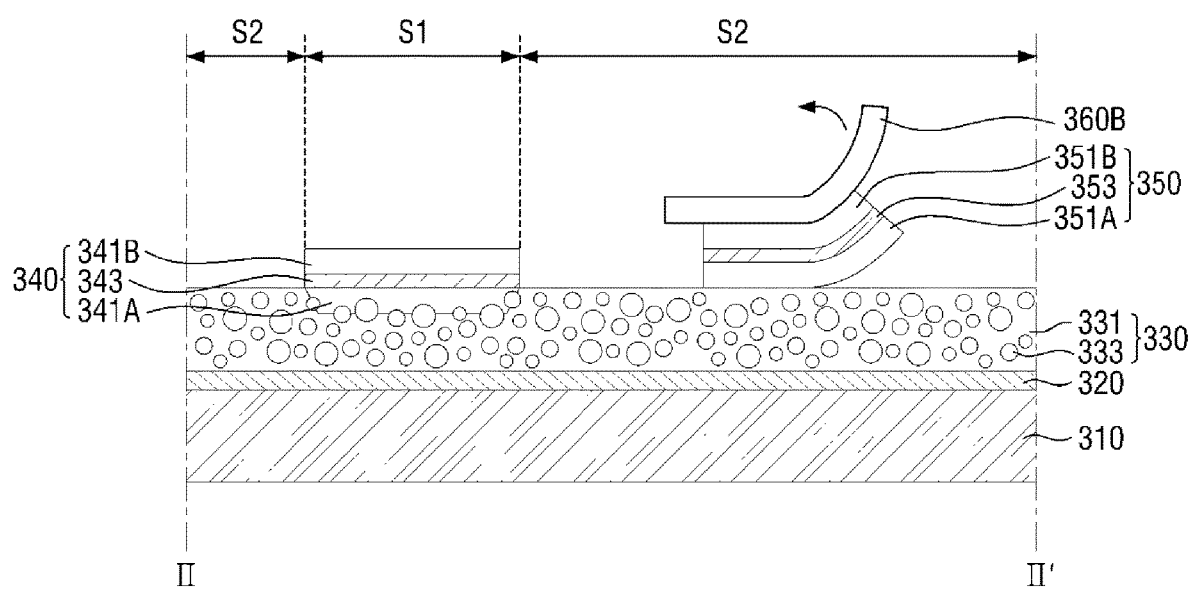

Thereafter, referring to FIGS. 9 and 17, the FPCB 300 is completed by removing the second adhesive 350 together with the second release layer 360B from the passivation layer 330 (S8). The second adhesive 350 and the second release layer 360B may be adhesives for assembling elements to realize process automation of the FPCB 300 and/or the display device 1. In this case, after an assembly process, the second adhesive 350 may be removed together with the second release layer 360B. That is, the second adhesive 350 is removably disposed together with the second release layer 360B, from the FPCB 300. Since the second adhesive 350 is in contact with the passivation layer 330 at the second region S2 that has not been subjected to the plasma etching treatment process P, the bonding force of the second adhesive 350 with respect to the passivation layer 330 may be relatively weak. Thus, during the removal of the second release layer 360B, the second adhesive 350 may be peeled off of the passivation layer 330 together with the second release layer 360B.

Moreover, since the adhesive strength of the third adhesive layer 351A is less than the adhesive strength of the fourth adhesive layer 351B, the bonding force between the third adhesive layer 351A and the passivation layer 330 may be weaker than the bonding force between the fourth adhesive layer 351B and the second release layer 360B. Accordingly, the second adhesive 350 can be easily peeled off, and as a result, defects that may be caused by any remaining adhesives for assembling elements can be reduced or effectively prevented.

FIGS. 9 through 17 illustrate that the first release layer 360A is removed first and then the second release layer 360B is removed, but the present disclosure is not limited thereto. Alternatively, the first and second release layers 360A and 360B may be removed at the same time. Still alternatively, the second release layer 360B may be removed first, and then the first release layer 360A may be removed.

However, the effects of the embodiments are not restricted to the one set forth herein. The above and other effects of the embodiments will become more apparent to one of ordinary skill in the art to which the embodiments pertain by referencing the claims.

Although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
   a display panel including a display surface and a rear surface which is opposite to the display surface; and
   a flexible printed circuit board attachable to the display panel at the rear surface of the display panel,
   wherein
   the flexible printed circuit board includes a conductive layer, a passivation layer defining an outer surface of the flexible printed circuit board, and a base film facing the passivation layer with the conductive layer therebetween,
   the outer surface includes a first region of the passivation layer at which the rear surface of the display panel is attachable to the flexible printed circuit board and a second region of the passivation layer at which the rear surface of the display panel is not attached to the flexible printed circuit board, and
   the first region of the passivation layer has a greater surface roughness than the second region of the passivation layer.

2. The display device of claim 1, further comprising a first adhesive attachable to the display panel and to the passivation layer at the first region thereof.

3. The display device of claim 2, wherein an overlapping area of the first adhesive and the first region of the passivation layer is larger than an overlapping area of the first adhesive and the second region of the passivation layer.

4. The display device of claim 3, wherein within the flexible printed circuit board, the passivation layer includes a resin layer and fillers which are dispersed in the resin layer.

5. The display device of claim 4, wherein at the first region of the passivation layer, the fillers are projected from the resin layer to be exposed outside of the resin layer.

6. The display device of claim 5, wherein attachment of the first adhesive at the first region of the passivation layer disposes the first adhesive in contact with both the resin layer and with the fillers which are exposed outside of the resin layer.

7. The display device of claim 6, wherein within the passivation layer of the flexible printed circuit board,
the resin layer includes an organic material, and
the fillers include an inorganic material.

8. The display device of claim 2, wherein
the first adhesive includes a first adhesive layer at which the first adhesive is attachable to the passivation layer at the first region thereof, a second adhesive layer at which the first adhesive is attachable to the display panel, and a first base layer between the first adhesive layer and the second adhesive layer, and
an adhesive strength of the first adhesive layer is greater than an adhesive strength of the second adhesive layer.

9. The display device of claim 8, further comprising a first release layer removably attachable to the second adhesive layer,
wherein an adhesive strength between the passivation layer and the first adhesive layer is greater than an adhesive strength between the first release layer and the second adhesive layer.

10. The display device of claim 1, wherein an average thickness of the passivation layer at the first region thereof is less than an average thickness of the passivation layer at the second region thereof.

11. The display device of claim 10, wherein the first region of the passivation layer is a plasma-etched region of the passivation layer.

12. The display device of claim 1, wherein
at the first region, the passivation layer defines a depression recessed from the outer surface at the second region,
the depression is defined by a bottom surface and side surfaces which connect the bottom surface and the outer surface at the second region to each other, and
a surface roughness of the passivation layer at the bottom surface of the depression is greater than a surface roughness of the side surfaces of the depression.

* * * * *